United States Patent [19]

Galton

[11] Patent Number: 5,196,852
[45] Date of Patent: Mar. 23, 1993

[54] ANALOG-TO-DIGITAL CONVERTER USING PARALLEL ΔΣ MODULATORS

[75] Inventor: Ian A. Galton, Pasadena, Calif.

[73] Assignee: California Institute of Technology, Pasadena, Calif.

[21] Appl. No.: 839,793

[22] Filed: Feb. 21, 1992

[51] Int. Cl.$^5$ .............................................. H03M 3/02
[52] U.S. Cl. ...................................... 341/143; 375/28
[58] Field of Search ............... 341/143, 131, 155, 159, 341/160; 375/26, 27, 28

[56] References Cited

U.S. PATENT DOCUMENTS 5,073,777  12/1991  Fukuhara et al. .................... 341/131
5,075,679  12/1991  Gazsi ................................... 341/143

OTHER PUBLICATIONS

J. C. Candy, et al., "Oversampling Methods for A/D and D/A Converters," Oversampling Delta-Sigma Data Converters, Theory, Design and Simulations, edited by J. D. Candy and G. C. Temes, pp. 1-25, IEEE Press, New York, 1992.
J. C. Candy, "A use of double integration in sigma-delta modulation," IEEE Trans. Commun., vol. COM-33, pp. 249-258, Mar. 1985.
M. Hall, Jr., Combinatorial Theory, (2nd Ed.), pp. 238-263, John Wiley & Sons, 1967.
F. H. Harmuth, Sequency Theory, pp. 143-150, New York, New York, Academic Press, 1977.
L. C. Fernandez, et al., "Design of a synchronous Walsh-Function Generator," IEEE Trans. Electromagnetic Compatibility, vol. EMC-19, No. 4, pp. 407-409, Nov. 1977.
F. Kitai, et al., "Walsh function generators," Applications of Walsh functions and sequency theory, pp. 297-315, IEEE Press, New York, 1974.
P. W. Besslich, "Walsh function generators for minimum orthogonality error," Trans. Electromagnetic Compatibility, vol. EMC-15, No. 4, pp. 177-179, Nov., 1973.
J. H. van Lint, et al., A Course if Combinatorics, Cambridge University Press, (to appear in 1992).
S. H. Ardalan, et al., "An Analysis of Nonlinear Behavior in Delta-Sigma Modulators," IEEE Trans. Circuits and Sys., vol. CAS-34, 593-603, Jun., 1987.
J. C. Candy, "A Use of Limit Cycle Oscillations to Obtain Robust Analog-to-Digital Converters", IEEE Trans. Commun., vol. Com-22, pp. 298-305, Mar. 1974.
W. Chou, et al., "Multistage Sigma-Delta Modulation" IEEE Trans. Inform. Theory, vol. IT-35, pp. 784-796, Jul. 1989.
R. M. Gray, "Oversampled Sigma-Delta Modulation," IEEE Trans. Commun., vol. COM-35, pp. 481-489, May 1987.
J. C. Candy, et al., "Using Triangularly Weighted Interpolation to Get 13-Bit PCM from a Sigma-Delta Modulator," IEEE Trans. Commun., vol. COM-24, pp. 1268-1275, Nov. 1976.
A. Ghafoor, "Partitioning of Even Networks for Improved Diagnosability," IEEE Transactions on Reliability, vol. 39, No. 3, pp. 281-286, Aug. 1990.

*Primary Examiner*—A. D. Pellinen
*Assistant Examiner*—Brian Young
*Attorney, Agent, or Firm*—Antonio M. Fernandez

[57] ABSTRACT

An approach is presented for relaxing the oversampling requirements in a ΔΣ modulator based analog-to-digital converter through parallel ΔΣ modulation channels with decimation filtering and modulation by sequences $u_r(n)$ and $v_r(n)$ derived, for example, from an M×M Hadamard matrix. By combining M ΔΣ modulators, each with an oversampling ratio of N, an effective oversampling ratio of approximately NM is achieved with only an M-fold increase in the quantization noise power. In the special case of N=1, full-rate analog-to-digital conversion is achieved. The individual ΔΣ modulators can be any selected from a large class of popular ΔΣ modulators. Unlike most other approaches to trading modulator complexity for accuracy, the system retains the robustness of the individual ΔΣ modulators to circuit imperfections.

8 Claims, 5 Drawing Sheets

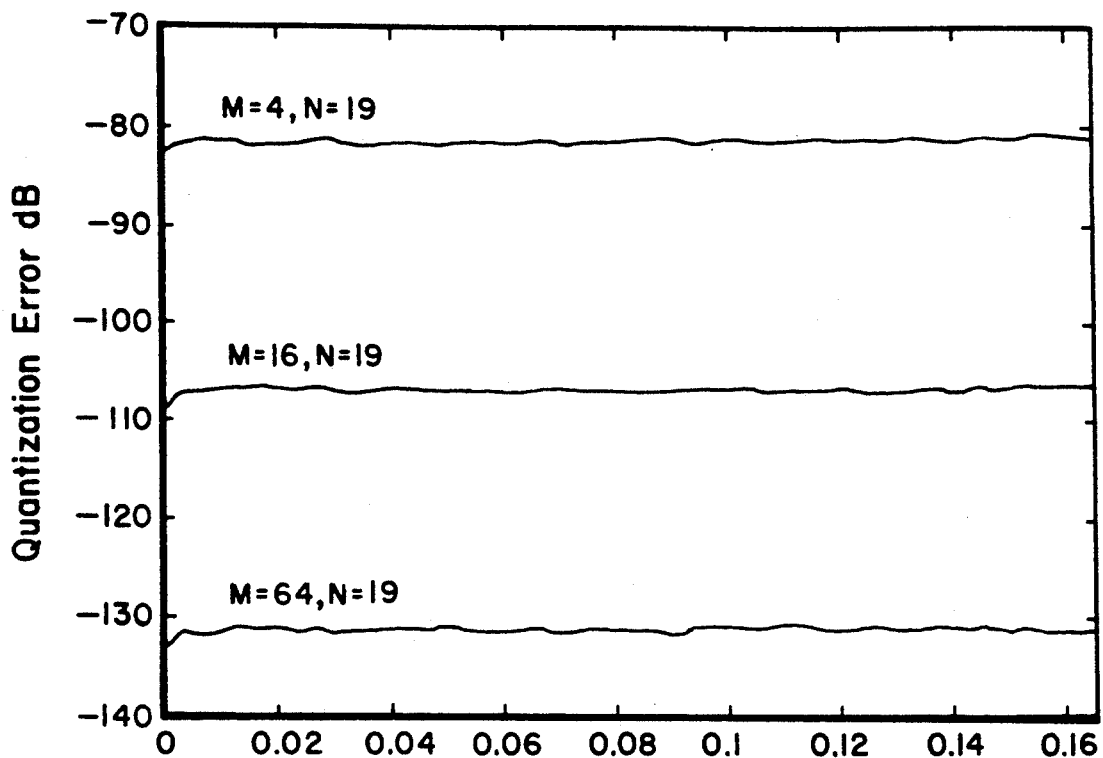
FIG.7    Amplitude of Sinusoid Input
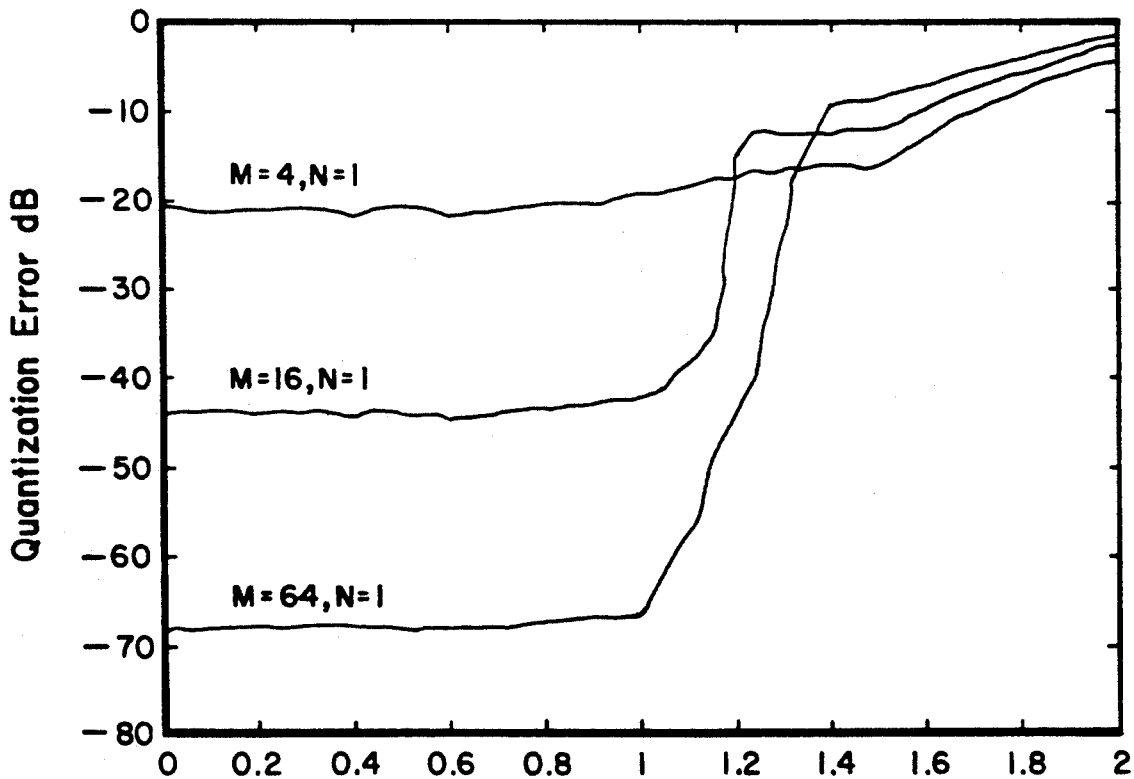
FIG.8    Frequency of Sinusoid Input

ANALOG-TO-DIGITAL CONVERTER USING PARALLEL ΔΣ MODULATORS

FIELD OF THE INVENTION

The invention relates to both oversampled and full-rate converters.

BACKGROUND OF THE INVENTION

Primarily because of advances in VLSI technology, ΔΣ modulator based A/D converters have become popular in applications requiring high precision. [J. C. Candy and G. C. Temes, "Oversampling Methods for A/D and D/A Converters," *Oversampling Delta-Sigma Data Converters Theory, Design and Simulations*, edited by J. C. Candy and G. C. Temes, pp. 1-25, IEEE Press, New York 1992.]Although they employ complicated digital circuitry, their relatively simple analog circuitry tends to be robust with respect to component inaccuracies and noise. They generally do not require the trimmed components or precise reference voltages necessary in conventional A/D converters. Since fine-line VLSI technology is more amendable to high density, high speed digital circuitry than to accurate analog circuitry, ΔΣ modulator based converters are attractive candidates for VLSI implementation.

There are many types of ΔΣ modulators that may be used to implement the present invention. From a signal processing point of view, a large portion of them are special cases of an underlying generic system. An example is a second-order ΔΣ modulator system shown in FIG. 1 [Candy and Temes (1992), supra, p. 7] which satisfies the criteria of a generic system. The criteria are: (1) that it be an electronic system that operates on a discrete analog sequence and outputs a discrete time digital sequence at the same sample rate; (2) that the system contain quantizers; and (3) from a signal processing point of view, it has the property that if all quantizers are replaced by identity operators (e.g., wires), the output $y(n)$ is related to the input $x(n)$ as $y(n)=x(n-L)$, where L is defined as the system delay, and when the quantizers are present the output is related to the input as $y(n)=x(n-L)+e(n)$, where $e(n)$ is a quantization error term.

A ΔΣ modulator based oversampling A/D converter is comprised of a ΔΣ modulator, a lowpass filter, and an N-sample decimator as shown in FIG. 2. The filter and decimator are together referred to as a decimation filter. Typically, the discrete-time analog input sequence corresponds to a continuous-time signal sampled at a rate $Nf$, where N is a positive integer referred to as the oversampling ratio and f is the Nyquist rate. This insures that the spectrum of the input sequence is restricted to $$\left(-\frac{\pi}{N}, \frac{\pi}{N}\right).$$

The decimation filter reduces the rate of the output sequence to f.

The main idea behind all the ΔΣ modulator variations is simple. In each system, the quantizers can be thought of as devices that add quantization noise sequences to their inputs. Since these sequences are injected into the system at the quantizer locations, they see a different filter configuration than the input sequence. The combination of filters is such that the input sequence is only delayed while the quantization noise sequences are highpass filtered. If the input sequence occupies the low frequency portion of the spectrum in which the quantization noise has been attenuated, subsequent lowpass decimation filtering can remove much of the remaining quantization noise without greatly distorting the input sequence. It is for this reason that ΔΣ modulators find application in oversampled A/D converters. Oversampling insures that the input sequence occupies only a low frequency portion of the spectrum, and decimation filtering removes the out-of-band quantization noise and reduces the output sample rate to the Nyquist rate.

The oversampling requirement is the essential drawback of ΔΣ modulator based converters; the circuitry must be designed to operate at a significantly higher rate than the system produces output samples. The greater the required accuracy of the A/D converted sequence, the larger the necessary oversampling ratio. Hence, accuracy is limited by circuit speed.

The proliferation of ΔΣ modulator architectures represents the continuing search for systems that require smaller oversampling ratios for a given level of accuracy. Most of the research has emphasized designing the filters and topology of the ΔΣ modulator to increase the frequency band over which the quantization noise is attenuated. Because of the nonlinearity introduced by the quantizers and the requirement that the topology of the system be amendable to VLSI implementation, this has proven to be a difficult problem. In particular, it is difficult to choose the architecture so as to minimize the required oversampling ratio while maintaining stability and a high tolerance to circuit imperfections.

SUMMARY OF THE INVENTION

In accordance with the present invention, an analog-to-digital converter is comprised of multiple parallel channels, each of which operates on the same analog input signal (possibly sampled at discrete time intervals), and whose outputs are summed to produce the overall digital output. Each channel is comprised of a device that multiplies its input by an internally generated sequence followed by a ΔΣ modulator based oversampling analog-to-digital converter, where oversampling is by a factor N, and by another device that multiplies its input by another internally generated sequence. The ΔΣ modulator based analog-to-digital converter of each channel is comprised of a ΔΣ modulator followed by a digital filter and means for decimation of the digitally sampled sequence by the factor N. The internally generated sequences are preferably derived from a Hadamard matrix, in which case the multipliers are implemented as the equivalent of sign inverters, or are possibly derived from a unitary matrix. In the special case of N=1, the parallel channels operate together as a full-rate analog-to-digital converter.

BRIEF DESCRIPTION OF THE DRAWINGS

FIG. 7 shows simulation quantization error power results of four, sixteen and sixty-four channel $\pi\Delta\Sigma$ modulators, each with an oversampling ratio of N=19 and sine wave inputs of amplitude 0.5 using secondorder order double-loop $\Delta\Sigma$ modulators with four level quantizers and $\Delta=1$.

FIG. 8 shows quantization power of full-rate (N=1) $\pi\Delta\Sigma$ modulators of four, sixteen and sixty-four channel $\pi\Delta\Sigma$ modulators on a sine wave of fixed frequency, $\omega=3.71$, using second-order double-loop $\Delta\Sigma$ modulators with four level quantizers and $\Delta=1$.

The novel features that are considered characteristic of this invention are set forth with particularity in the appended claims. The invention will best be understood from the following description when read in connection with the accompanying drawings.

DESCRIPTION OF PREFERRED EMBODIMENTS

The present invention proposes an alternative approach in which multiple $\Delta\Sigma$ modulator based converters are operated in parallel in such a way that an effective oversampling ratio is achieved that is significantly higher than the actual oversampling ratio. The architecture is called the $\pi\Delta\Sigma$ modulator. ($\pi$ is used as a mnemonic for "parallel.") Since there is no clear "best" type of $\Delta\Sigma$ modulator for all applications, the invention does not require that the $\pi\Delta\Sigma$ modulator be restricted to a single type of component $\Delta\Sigma$ modulator. Most of the known $\Delta\Sigma$ modulators can be used.

The primary advantage of the $\pi\Delta\Sigma$ modulator is that it combines a plurality, M, of $\Delta\Sigma$ modulator based converters with an oversampling ratio of N and achieves an accuracy commensurate with an oversampling ratio of approximately NM aside from an M-fold increase in the quantization noise power. For example, second-order $\Delta\Sigma$ modulators provide approximately 2.5 bits of accuracy for every doubling of the oversampling ratio, N. [J. C. Candy, "A use of double integration in sigma-delta modulation," *IEEE Trans. Commun.*, Vol. COM-33, pp. 249–258, Mar. 1985.] Hence, for every doubling of M, the $\pi\Delta\Sigma$ modulator would provide an additional 2 bits of accuracy. (The M-fold increase in quantization noise power is responsible for the 0.5 bit difference between the two values.) Another advantage of the $\pi\Delta\Sigma$ modulator is that it retains the robustness properties of the individual $\Delta\Sigma$ modulators and is not sensitive to channel gain deviations.

In the special case of N=1, the $\pi\Delta\Sigma$ modulator operates as a full-rate A/D converter; the input sample rate equals the output sample rate. The only other known practical A/D converter architecture with this property is a direct or "flash" converter. As will be fully appreciated from the following discussion, the full-rate $\pi\Delta\Sigma$ modulator compares favorably with the flash converter.

The main drawback of the $\pi\Delta\Sigma$ modulator is that it requires a large amount of digital processing. The oversampling converter on each channel typically requires a filter of length N(2M−1). Although the filters are simple integer FIR filters in which explicit multiplications can be avoided, they occupy most of the space required by the $\pi\Delta\Sigma$ modulator.

Figure 3:
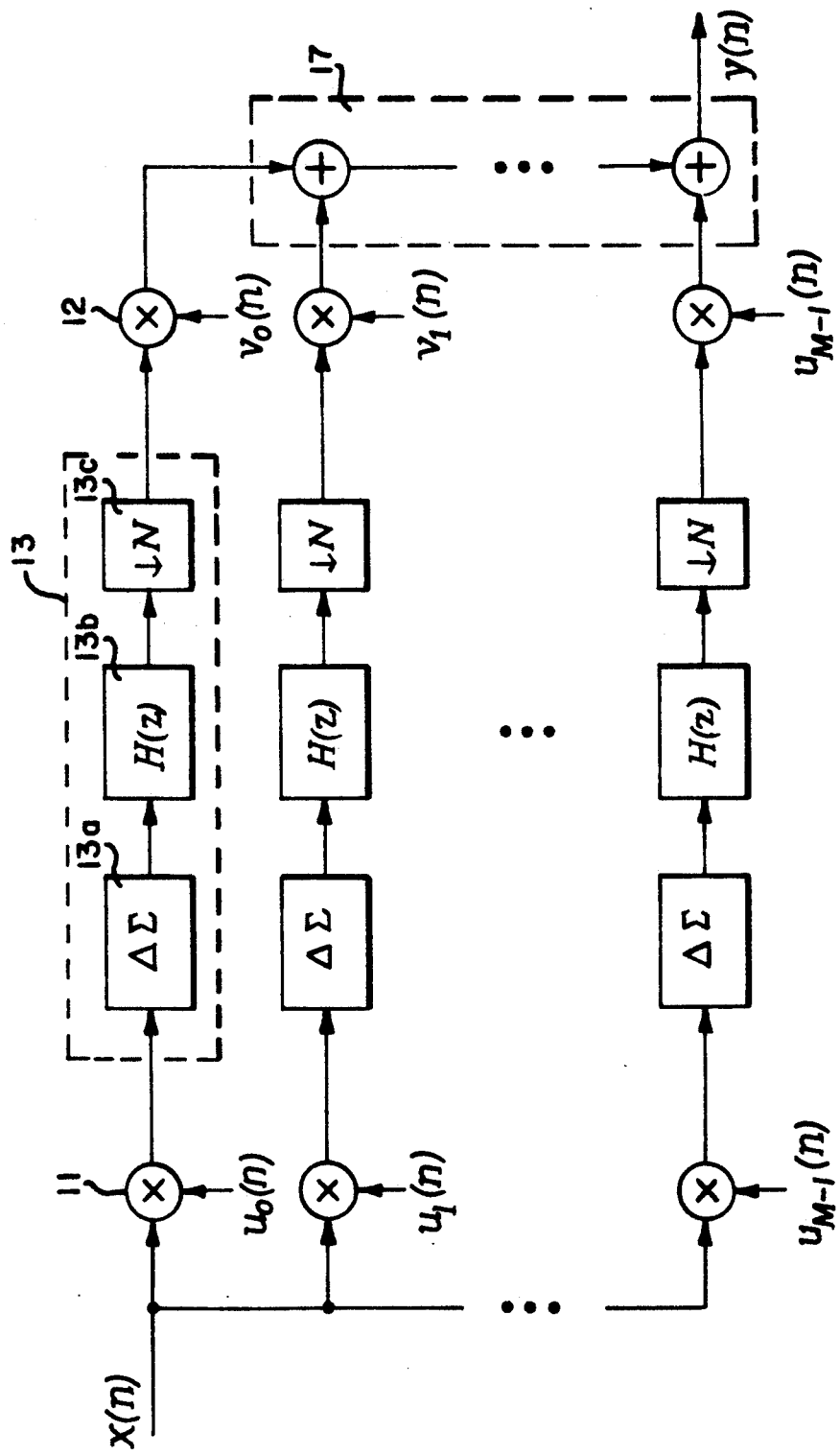
FIG. 3 illustrates an architecture for a $\pi\Delta\Sigma$ modulator with an oversampling ratio N in accordance with the present invention.

The $\pi\Delta\Sigma$ modulator architecture is shown in FIG. 3. It consists of M channels $C_0, C_1, \ldots C_{M-1}$ that operate on the analog input sequence in parallel. Each channel contains two binary multipliers 11 and 12 capable of multiplying their inputs by plus or minus one and a $\Delta\Sigma$ modulator based oversampling A/D converter 13. The $r^{th}$ channel multiplies the analog input sequence by the internally generated sequence $u_r(n)$, performs an oversampled A/D conversion of the product, and multiplies the resulting digital sequence by the internally generated sequence $v_r(n)$. The output sequence, y(n), is the digital sum of the output sequences from all the channels.

Figure 4:
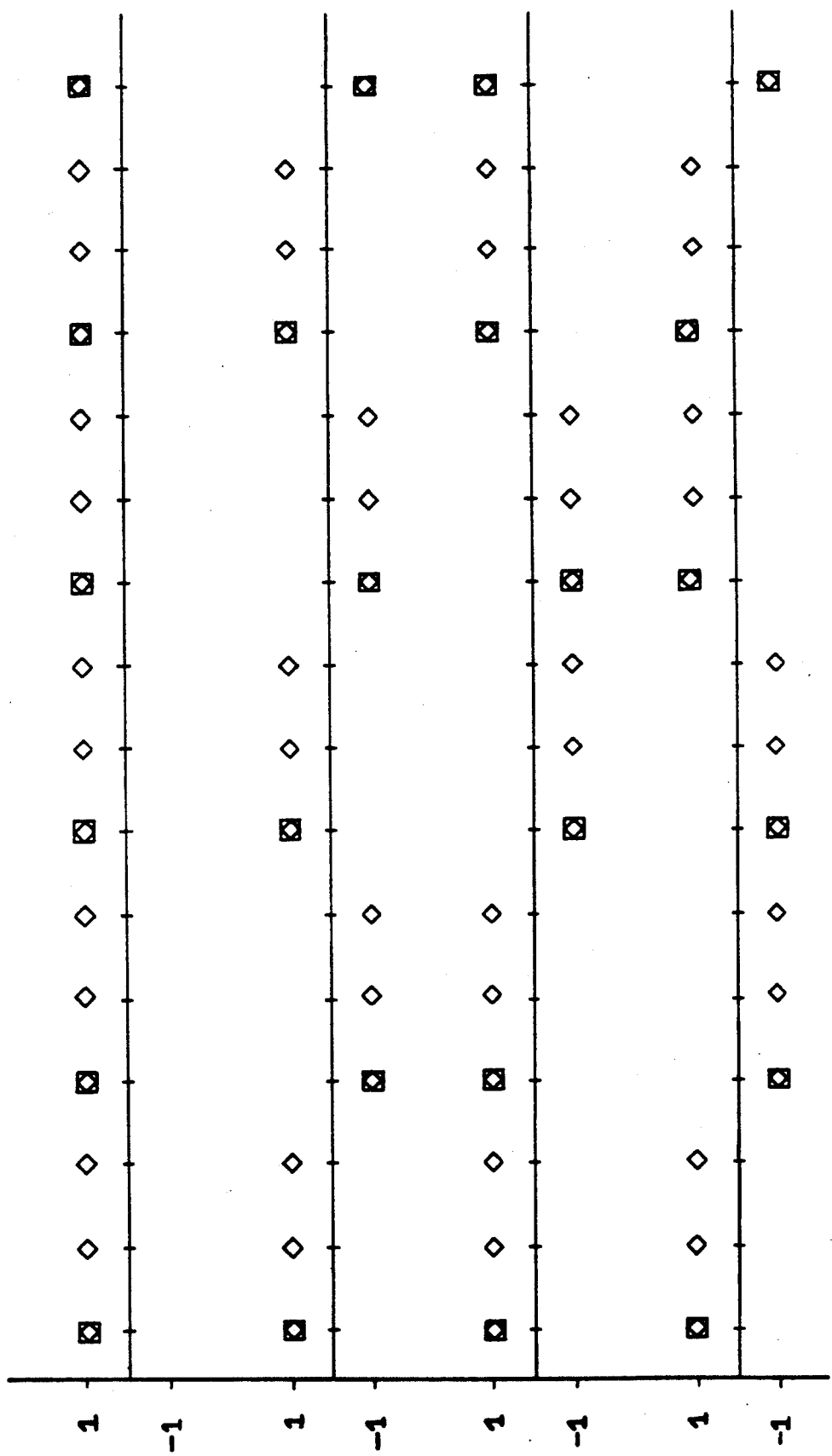
FIG. 4 illustrates an example of Hadamard modulation sequences $u_r(n)$ and $v_r(n)$ for the parallel $\Delta\Sigma$ modulator of FIG. 3 with M=4, N=3 and L=1 in which the diamonds correspond to $u_r(n)$ and the squares correspond to $v_r(n)$, and each graph corresponds to one channel plotted against input sequence sample times represented by tick marks.

Each sequence is derived from an MxM Hadamard matrix, H, which consists exclusively of plus and minus ones and has the property that $H^T H = MI$, where I is the identity matrix. [M. Hall, Jr., *Combinatorial Theory*, (2nd Ed.), pp. 238–263, John Wiley & Sons, (1967).] If $m(j,k), 0 \leq j, k \leq M-1$, is the element on the $j^{th}$ row and $k^{th}$ column of H, then $u_r(n)$ and $v_r(n)$ are defined as follows:

$$u_r(n) = m\left(r, \left\lfloor \frac{n+L-1}{N} \right\rfloor \mod M \right), \quad (1)$$

and $$v_r(n) = m(r, n \mod M), \quad (2)$$

where L is the signal delay of the $\Delta\Sigma$ modulators, and brackets $\lfloor \ \rfloor$ denote a floor function, namely that for each $\chi \in R, \lfloor \chi \rfloor$ equals the greatest integer less than or equal to $\chi$. For example, $\lfloor 3.2 \rfloor = 3$, and $\lfloor -3.2 \rfloor = -4$. FIG. 4 shows as an example a set of Hadamard modulation sequences for the case of M=4, N=3, and L=1. Since Hadamard matrices of a given size are not unique, other Hadamard modulation sequences that satisfy the definition above exist.

Because Hadamard matrices consist solely of plus and minus ones, the Hadamard modulation sequences also consist solely of plus and minus ones. Hence, the multipliers need only pass or invert the signs of their input depending upon whether the current value of the modulation sequence is +1 or −1, respectively. For the first multiplier 11 on each channel $C_r$, this requires the capability of analog sign inversion, and for the second multiplier 12 it requires the capability of digital sign inversion. Indeed, the reason for preferring the Hadamard matrix is that it simplifies the design of the multipliers. Although modulation sequences generated from any unitary matrix will work in the $\pi\Delta\Sigma$ modulator framework, Hadamard sequences are the only such sequences consisting exclusively of plus and minus ones.

The use of Hadamard modulation, however, imposes a restriction on the number of channels, M. Specifically, M must be chosen such that there exists an MxM Hadamard matrix. A sufficient condition for this to occur is that M be a non-negative power of two. Several simple circuits for generating Hadamard modulation sequences when M is any non-negative power of two have been presented. [F. H. Harmuth, *Sequency Theory*, pp. 143-150, New York, New York, Academic Press, (1977); L. C. Fernandez, K. R. Rao, "Design of a Synchronous Walsh-Function Generator," *IEEE Trans. Electromagnetic Compatibility*, Vol. EMC-19, No. 4, pp. 407-409, Nov., 1977; F. Kitai, C. K. Yuen, "Walsh function generators," *Applications of Walsh functions and sequency theory*, pp. 297-315, IEEE Press, New York (1974); P. W. Besslich, "Walsh function generators for minimum orthogonality error," *Trans. Electromagnetic Compatibility*, Vol. EMC-15, No. 4, pp. 177-179, Nov. 1973.] Hadamard matrices also exist for which M is not a power of two. In that case, a necessary condition is that M be a multiple of four. [J. H. van Lint, R. M. Wilson, *A Course in Combinatorics*, Cambridge University Press, (to appear in 1992); Hall, Jr., (1967), supra.] Indeed, Hadamard matrices for every multiple of four less than 428 are known and mathematicians have conjectured (but not proven) that such matrices exist for all multiples of four.

The A/D converter 13 on each channel consists of a $\Delta\Sigma$ modulator 13a, a lowpass digital filter 13b, and an N-sample decimator 13c. The implementation of the A/D converters is the central design problem associated with the $\pi\Delta\Sigma$ modulator. One question that must be answered is what type of $\Delta\Sigma$ modulator should be used. The answer depends in large measure on the application and is not greatly influenced by the use of the $\pi\Delta\Sigma$ modulator architecture, so long as the $\Delta\Sigma$ modulator satisfies the criteria of a generic system and the restriction that if different types of $\Delta\Sigma$ modulators are used in the same $\pi\Delta\Sigma$ modulator, they must have the same signal delay, L.

Another question associated with the design of the oversampling A/D converters is what frequency response should the decimation filter H(z) have. Again, the answer is largely dependent upon the application, although the $\pi\Delta\Sigma$ modulator architecture does impose a restriction upon the length of the filter. It requires that the filter have a length no greater than $N(2M-1)$. In general, H(z) should be designed as if the $\Delta\Sigma$ modulator and the filter were to be used in isolation with an oversampling ratio of NM.

The idea behind the $\pi\Delta\Sigma$ modulator is simple. As in conventional $\Delta\Sigma$ modulator based converters, the goal is to filter out as much of the quantization noise as possible without significantly distorting the input sequence. As described above, the $\Delta\Sigma$ modulator applies a highpass filter to the noise without changing the spectral content of the input sequence. In a conventional $\Delta\Sigma$ modulator based converter, the signal and the highpass filtered noise are lowpass decimation filtered together. In contrast, the $\pi\Delta\Sigma$ modulator effectively applies a different lowpass filter to the input sequence than it does to the highpass filtered noise. The input sequence sees a filter with a wide passband while the highpass filtered noise sees a filter with a narrow passband. Hence, more of the quantization noise is removed than in the conventional system.

Figure 1:
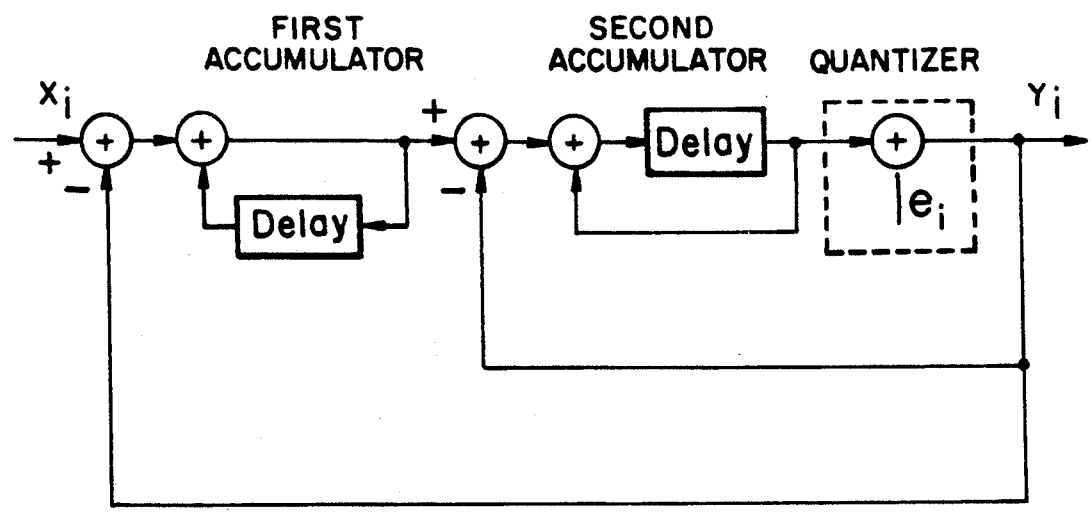
FIG. 1 illustrates an architecture for a second-order ΔΣ modulator that, as an example of one that satisfies criteria of a generic system, may be used in the present invention.
Figure 2:
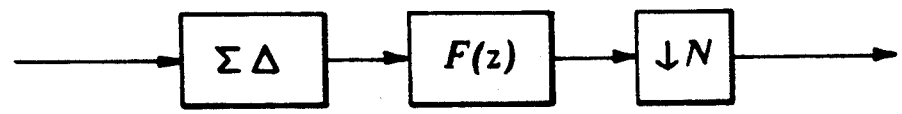
FIG. 2 illustrates a conventional ΔΣ modulator used in an oversampled A/D converter having a filter, F(z), and a decimator, ↓N, which together form a decimation filter.
Figure 5:
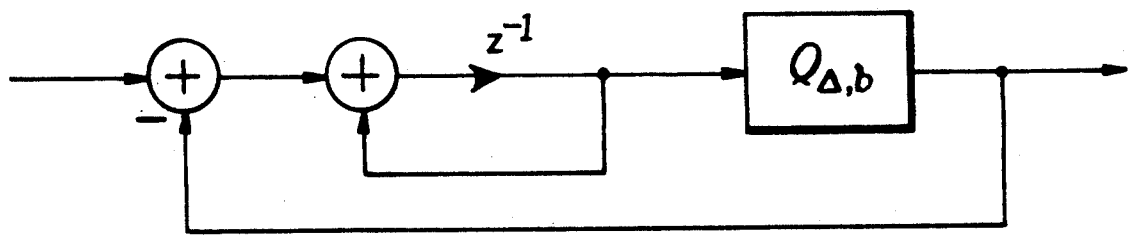
FIG. 5 illustrates a single-loop first-order $\Delta\Sigma$ modulator.

For example, consider a sixteen channel $\pi\Delta\Sigma$ modulator employing the single-loop $\Delta\Sigma$ modulator shown in FIG. 5 and an oversampling ratio $N=15$. Take the filters, H(z), to have the triangular impulse response of length $N(2M-1)=465$ given by $$h(n) = \begin{cases} \frac{1}{233^2}(n+1), & \text{if } 0 \leq n \leq 232; \\ \frac{1}{233^2}(464-n), & \text{if } 233 \leq n \leq 464; \\ 0, & \text{otherwise} \end{cases} \quad (3)$$

Figure 6:
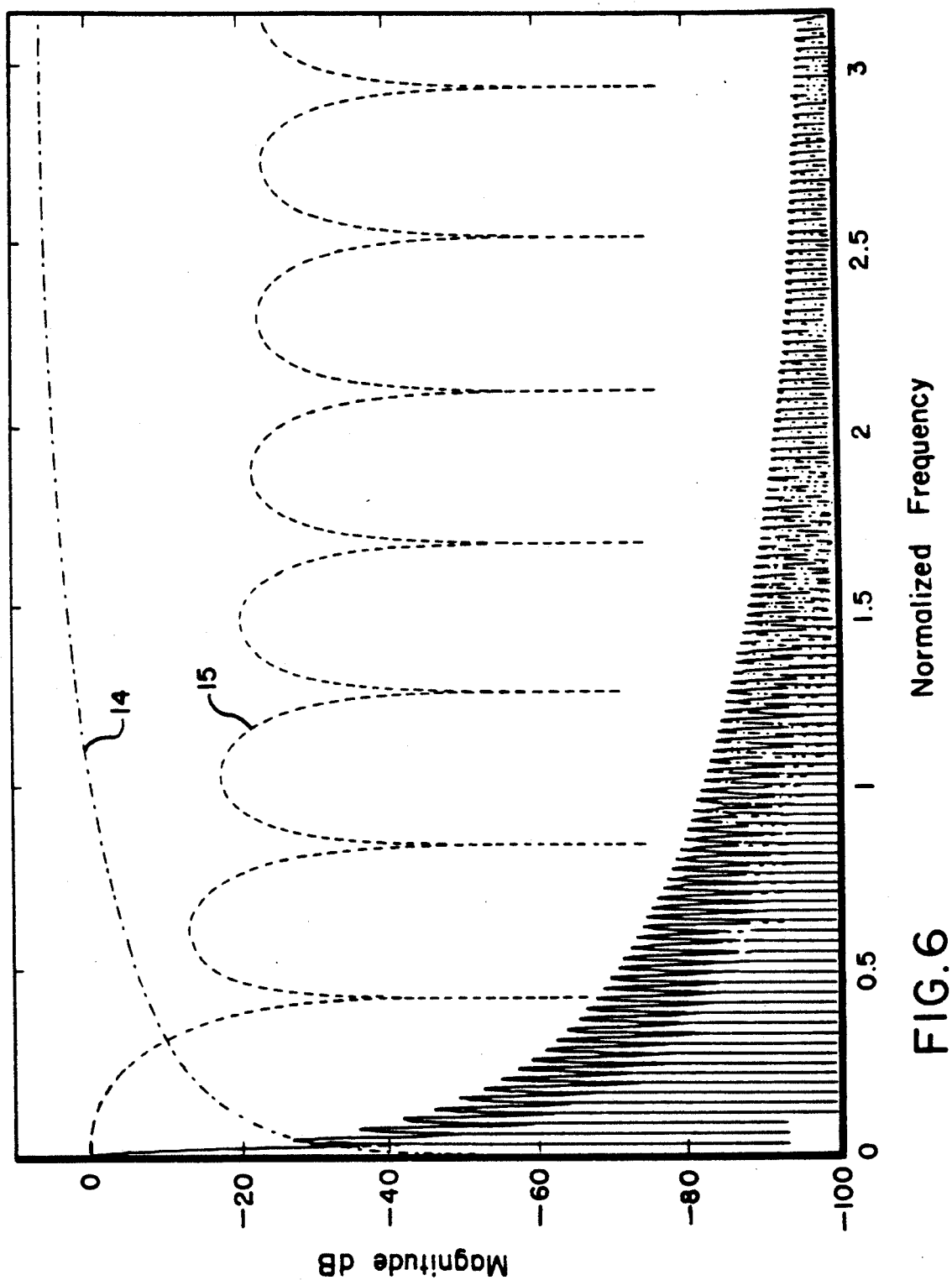
FIG. 6 illustrates in a graph the filtering performed by the $\pi\Delta\Sigma$ modulator of FIG. 3 using the $\Delta\Sigma$ modulator of FIG. 5 with the dashed-dotted curve showing the filter response applied to the quantization noise on each channel of the decimation filter H(z) and the dashed curve showing the overall filter response applied to the input sequence by the parallel $\Delta\Sigma$ modulator.

From FIG. 5, it is easy to verify that each $\Delta\Sigma$ modulator itself filters the quantization noise by $1-z^{-1}$, while subjecting the $\Delta\Sigma$ modulator input sequence to only a delay, $z^{-1}$. The frequency response of this noise filter is shown as the dashed-dotted curve 14 in FIG. 6. Together, these two filters attenuate the quantization noise on each channel. As will be shown, aside from adding quantization noise, the overall effect of the $\pi\Delta\Sigma$ modulator on the input sequence is to apply a filter $H'(z)$ with the response shown as the dashed curve 15 in FIG. 6. Because the input sequence is oversampled by a factor of fifteen, its energy is restricted to the frequency band $$\left(-\frac{\pi}{15}, \frac{\pi}{15}\right).$$

This is sufficiently narrow that $H'(z)$ does not significantly distort the input sequence. Hence, the quantization noise on each channel is highly attenuated, while the input sequence is passed.

Although the outputs of the channels are summed in a network 17, the quantization noise does not add coherently. Therefore, in the example above, summing the channels increases the noise power by a factor of sixteen. This raises the noise floor by about 12dB or, equivalently, two bits of precision are lost. The increase in noise power is more than compensated by the reduction in quantization noise achieved by each channel.

$\pi\Delta\Sigma$ modulator simulation results will now be presented. In each simulaton, second-order double-loop modulators $\Delta\Sigma$ Candy (1985), supra] with four level quantizers for which $\Delta=1$ were used. Random numbers of variance $8.3 \cdot 10^{-6}$ were added to the inputs to simulate the effect of analog circuit noise.

FIG. 7 shows simulations of four, sixteen and sixty-four channel $\pi\Delta\Sigma$ modulators, each with an oversampling ratio of nineteen and sine wave inputs of amplitude 0.5. The quantization error power of each $\pi\Delta\Sigma$ modulator is plotted against the frequency of the sine wave. The frequency range shown in $$\left[0, \frac{\pi}{19}\right)$$

which corresponds to full bandwidth after decimation by nineteen.

The results show that the quantization error power is not dependent upon the frequency of the input. If the $\pi\Delta\Sigma$ modulator were a linear system, this would fully characterize the mean-squared quantization error performance. However, since the $\pi\Delta\Sigma$ modulator is not a linear system, it is possible that the quantization error power might be different for other types of input sequences. Nevertheless, simulations with other nonoverloading input sequences including finite sums of sinusoids and various colored random sequences do not indicate such a dependence. The same results were obtained for other oversampling ratios including the special case of N=1.

It is common to refer to the accuracy of a $\Delta\Sigma$ modulator based converter in terms of the number of bits that a uniform quantizer would require to generate the same quantization error power [Candy and Temes (1992), supra]. A frequently used formula relating bits of accuracy to the quantization error power of a nonoverloaded uniform quantizer is $$R = \tfrac{1}{2} \log_2 \frac{b_2}{3\sigma^2} \qquad (4)$$

where R is the number of bits, ($-$b,b] is the no overload range of the quantizer, and $\sigma^2$ is the quantization error power. Taking b=1 and applying this formula to the simulation results shown in FIG. 7 indicates that for an oversampling ratio of nineteen, accuracies of approximately 13, 17 and 21 bits are achieved by $\pi\Delta\Sigma$ modulators with four, sixteen and sixty-four channels, respectively. Hence, for each doubling of the M, accuracy of the $\pi\Delta\Sigma$ modulator is increased by approximately two bits.

FIG. 8 shows simulations of four, sixteen and sixty-four channel full-rate $\pi\Delta\Sigma$ modulators operating on a sine wave of fixed frequency, arbitrarily chosen as $\omega=3.71$. The quantization error power of each $\pi\Delta\Sigma$ modulator is plotted against the amplitude of the sine wave. The results show that when the amplitude of the input is bounded in absolute value by 1, the quantization error power is not a function of amplitude. However, the quantization error power increases strongly with input amplitudes greater than 1 as a result of quantizer overload. For $\Delta\Sigma$ modulators of the type simulated, overload occurs at input amplitudes of about 1 [Candy, (1985), supra], so it is not surprising that this is also the case with the $\pi\Delta\Sigma$ modulator. Simulations of $\pi\Delta\Sigma$ modulators with nonunity oversampling ratios show similar behavior.

Proceeding as above, for nonoverloading inputs, accuracies of approximately 2.5, 6.5, and 10.5 bits are achieved by full-rate $\pi\Delta\Sigma$ modulators with four, sixteen and sixty-four channels, respectively. Again, it is seen that for each doubling of M, the accuracy of the $\pi\Delta\Sigma$ modulator is increased by approximately two bits.

Although particular embodiments of the invention have been described and illustrated herein, it is recognized that modifications and variations may readily occur to those skilled in the art. Consequently, it is intended that the claims be interpreted to cover such modifications and variations.

What is claimed is:

1. An analog-to-digital converter comprising a plurality, M, of channels connected to operate in parallel on a sequence of analog input signal samples, x(n), received at a sampling rate Nf, where f is the Nyquist sample rate of said input signal and N, a constant positive integer, is an oversampling ratio, each channel comprising, means for multiplying each of said signal samples in sequence at said sampling rate Nf by a sequence of multipliers, $u_r(n)$, of $+1$ and $-1$ derived from an MxM Hadamard matrix, a delta-sigma modulator for analog-to-digital conversion of said modulated signal samples in sequence, means for digitally filtering said analog-to-digital signal samples in sequence at a rate f and decimation of said signal samples in sequence by a factor N, and means for digitally multiplying said digitally filtered signal samples in sequence at a rate f by a sequency of multipliers, $v_r(n)$, of $+1$ and $-1$ derived from an MxM Hadamard matrix, where the rate of said sequence of multipliers $v_r(n)$ is that of $u_r(n)$ divided by said oversampling ratio, N, to produce a channel output sequence, wherein said multiplying means for said sequence of analog input samples and said digital multiplying means for said sequence of digitally filtered samples are comprised of sign inverters for each sample in sequence in response to said sequence of $+1$ and $-1$, and means for digitally summing all channel output sequences to produce an overall output.

2. An analog-to-digital converter as defined in claim 1 wherein the relationship between $u_r(n)$ and $v_r(n)$ is given by $$u_r(n) = m\left(r, \left\lfloor \frac{n+L-1}{N} \right\rfloor \bmod M \right),$$

$$v_r(n) = m(r, n \bmod M),$$

and $$u_r(n) = v_r\left( \left\lfloor \frac{n+L-1}{N} \right\rfloor \right),$$

where m is an element $m(j,K) 0 \leq j$, $k \leq M-1$ of the $j^{th}$ row and $k^{th}$ column of said Hadamard matrix, L is the signal delay of said delta-sigma modulators, and brackets denote a floor function.

3. An analog-to-digital converter as defined in claim 2 wherein N is an integer greater than 1 for an over sampled analog-to-digital converter.

4. An analog-to-digital converter as defined in claim 2 wherein N is equal to 1 for a full-rate analog-to-digital converter.

5. An analog-to-digital converter comprising a plurality, M, of channels connected to operate in parallel on a sequence of analog input signal samples, x(n), received at a sampling rate Nf, where f is the Nyquist sample rate of said input signal and N, a constant positive integer, is an oversampling ratio, each channel comprising, means for multiplying each of said signal samples in sequence at said sampling rate Nf by a sequence of multipliers, $u_r(n)$, derived from periodically repeating the rows of any MxM unitary matrix, a delta-sigma modulator for analog-to-digital conversion of said modulated signal samples in sequence, means for digitally filtering said analog-to-digital signal samples in sequence at a rate f and decimation of said signal samples in sequence by a factor N, and means for digitally multiplying said digitally filtered signal samples in sequence at a rate f by a sequence of multipliers, $v_r(n)$, derived from periodically repeating the rows of any MxM unitary matrix, where the rate of said sequence of multipliers $v_r(n)$ is that of $u_r(n)$ divided by said oversampling ratio, N, to produce a channel output sequence, and means for digitally summing all channel output sequences to produce an overall output.

6. An analog-to-digital converter as defined in claim 4 wherein the relationship between $u_r(n)$ and $v_r(n)$ is given by $$u_r(n) = m\left(r, \left\lfloor \frac{n+L-1}{N} \right\rfloor \bmod M \right),$$

$$v_r(n) = m(r, n \bmod M),$$

and $$u_r(n) = v_r\left(\left\lfloor \frac{n+L-1}{N} \right\rfloor\right),$$

where m is an element $m(j,k) \, 0 \leq j, k \leq M-1$ of the $j^{th}$ row and $k^{th}$ column of said unitary matrix, L is the signal delay of said delta-sigma modulators, and brackets denote a floor function.

7. An analog-to-digital converter as defined in claim 5 wherein N is an integer greater than 1 for an over sampled analog-to-digital converter.

8. An analog-to-digital converter as defined in claim 5 wherein N is equal to 1 for a full-rate analog-to-digital converter.

* * * * *